(12) United States Patent
Hong et al.

(10) Patent No.: US 10,255,843 B2
(45) Date of Patent: Apr. 9, 2019

(54) SCAN DRIVING CIRCUIT AND FLAT DISPLAY DEVICE THEREOF

(71) Applicant: Wuhan China Star Optoelectronics Technology Co., Ltd., Wuhan, Hubei (CN)

(72) Inventors: Guanghui Hong, Guangdong (CN); Qiang Gong, Guangdong (CN); Chunqian Zhang, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 112 days.

(21) Appl. No.: 15/316,153

(22) PCT Filed: Nov. 4, 2016

(86) PCT No.: PCT/CN2016/104610
§ 371 (c)(1),
(2) Date: Dec. 2, 2016

(87) PCT Pub. No.: WO2018/040276
PCT Pub. Date: Mar. 8, 2018

(65) Prior Publication Data
US 2018/0190178 A1 Jul. 5, 2018

(30) Foreign Application Priority Data

Aug. 29, 2016 (CN) .......................... 2016 1 07548764

(51) Int. Cl.
*G09G 3/20* (2006.01)
*G09G 3/3266* (2016.01)
(Continued)

(52) U.S. Cl.
CPC ......... *G09G 3/2092* (2013.01); *G09G 3/3266* (2013.01); *G09G 3/3677* (2013.01);
(Continued)

(58) Field of Classification Search
CPC ......... G09G 3/2092; G09G 2310/0281; G09G 2310/0283; G09G 2310/061; G09G 2310/08; H03K 19/20
See application file for complete search history.

(56) References Cited

U.S. PATENT DOCUMENTS 7,864,154 B2    1/2011  Kim et al.
9,824,621 B2 *  11/2017 Xiao ..................... G09G 3/2085
(Continued)

FOREIGN PATENT DOCUMENTS

CN    103489418 A    1/2014
CN    104900211 A    9/2015

*Primary Examiner* — Kwang-Su Yang
(74) *Attorney, Agent, or Firm* — Andrew C. Cheng (57) ABSTRACT

The disclosure discloses a flat panel display device and a scan driving circuit thereof. The scan driving circuit includes a plurality of first scan drivers and a plurality of second scan drivers that are cascaded, the plurality of first scan drivers and the plurality of second scan drivers receive a clock signal alternately. The plurality of first scan drivers and the plurality of second scan drivers perform cascaded transmission according to the clock signal. The disclosure performs cascaded transmission by interposing a clock signal, which can reduce the amount of input signals and simplify the array process.

12 Claims, 3 Drawing Sheets

(51) Int. Cl.
*G09G 3/36* (2006.01)
*G11C 19/28* (2006.01)
*H03K 19/20* (2006.01)

(52) U.S. Cl.
CPC ..... *G11C 19/28* (2013.01); *G09G 2310/0281* (2013.01); *G09G 2310/0283* (2013.01); *G09G 2310/0286* (2013.01); *G09G 2310/0291* (2013.01); *G09G 2310/061* (2013.01); *G09G 2310/08* (2013.01); *H03K 19/20* (2013.01)

(56) References Cited

U.S. PATENT DOCUMENTS

| | | |
|---|---|---|
| 2015/0015562 A1 | 1/2015 | Han et al. |
| 2015/0248867 A1 | 9/2015 | Tan et al. |
| 2016/0063958 A1* | 3/2016 | Tu .......................... G11C 19/00 345/213 |
| 2016/0351156 A1* | 12/2016 | Wu ........................ G11C 19/28 |
| 2017/0084238 A1* | 3/2017 | Cao ....................... G09G 3/3266 |

* cited by examiner

SCAN DRIVING CIRCUIT AND FLAT DISPLAY DEVICE THEREOF

TECHNICAL FIELD

The disclosure relates to a display technical field, and more particularly to a flat panel display device and a scan driving circuit thereof.

DESCRIPTION OF RELATED ART

A conventional flat panel display device adopts a scan driving circuit, which is producing the scan driving circuit on an array substrate by a conventional thin film transistor flat panel display array process to achieve a driving method of scanning line by line.

The scan driving circuit controls on or off of scanning lines on two levels by a scan driver in the prior art, but the amount of signals required to be input in the scan driving circuit is considerable, which can cause the amount of signals output by an integrated chip (IC) to be increased, as well as increasing complexity of an array process.

SUMMARY

The disclosure provides a flat panel display device and a scan driving circuit thereof, which can reduce the amount of input signals and simplify an array process.

To solve the technical problem above, the disclosure provides a scan driving circuit, which includes a plurality of first scan drivers and a plurality of second scan drivers that are cascaded, the plurality of first scan drivers and the plurality of second scan drivers receive a clock signal alternately, the plurality of first scan drivers and the plurality of second scan drivers perform cascaded transmission according to the clock signal.

Each of the first scan drivers includes a first latch circuit configured to receive the clock signal and a driving signal as well as outputting a first input signal, a first output circuit configured to receive the first input signal, the driving signal, a first control signal and a second control signal as well as outputting a first scanning signal according to the first control signal and outputting a second scanning signal according to the second control signal, a first reset circuit configured to receive a first voltage reference, a first reset signal, configured to reset the first scan drivers.

Each of the second scan drivers includes a second latch circuit configured to receive the clock signal and an input signal as well as outputting a second input signal, a second output circuit configured to receive the second input signal, the input signal, a third control signal and a fourth control signal as well as outputting a third scanning signal according to the third control signal and outputting a fourth scanning signal according to the fourth control signal, a second reset circuit configured to receive a first voltage reference, a second reset signal, configured to reset the second scan drivers.

The first latch circuit includes a first inverter, a first clock inverter and a second clock inverter, a first terminal of the first inverter, a fourth terminal of the first clock inverter and a second terminal of the second clock inverter receive the clock signal, a second terminal of the first inverter is connected with a second terminal of the first clock inverter and a fourth terminal of the second clock inverter, a first terminal of the first clock inverter receives the driving signal, a third terminal of the first clock inverter is connected with a third terminal of the second clock inverter, a first terminal of the second clock inverter outputs the first input signal.

To solve the technical problem above, the disclosure further provides a scan driving circuit, which includes a plurality of first scan drivers and a plurality of second scan drivers that are cascaded, the plurality of first scan drivers and the plurality of second scan drivers receive a clock signal alternately, the plurality of first scan drivers and the plurality of second scan drivers perform cascaded transmission according to the clock signal.

Each of the first scan drivers includes a first latch circuit configured to receive the clock signal and a driving signal as well as outputting a first input signal, a first output circuit configured to receive the first input signal, the driving signal, a first control signal and a second control signal as well as outputting a first scanning signal according to the first control signal and outputting a second scanning signal according to the second control signal, a first reset circuit configured to receive a first voltage reference, a first reset signal, configured to reset the first scan drivers.

The first latch circuit includes a first inverter, a first clock inverter and a second clock inverter, a first terminal of the first inverter, a fourth terminal of the first clock inverter and a second terminal of the second clock inverter receive the clock signal, a second terminal of the first inverter is connected with a second terminal of the first clock inverter and a fourth terminal of the second clock inverter, a first terminal of the first clock inverter receives the driving signal, a third terminal of the first clock inverter is connected with a third terminal of the second clock inverter, a first terminal of the second clock inverter outputs the first input signal.

The first output circuit includes a first NAND gate, a second NAND gate, a second inverter, a third inverter, a fourth inverter, a fifth inverter, a sixth inverter and a seventh inverter, a first terminal of the first NAND gate receives the first control signal, a second terminal of the first NAND gate and a second terminal of the second NAND gate are connected with a first terminal of the second clock inverter, a third terminal of the first NAND gate and a third terminal of the second NAND gate receive the driving signal, an output terminal of the first NAND gate is connected with an input terminal of the second inverter, an output terminal of the second inverter is connected with an input terminal of the third inverter, an output terminal of the third inverter is connected with an input terminal of the fourth inverter, an output terminal of the fourth inverter outputs the first scanning signal.

A first terminal of the second NAND gate receives the second control signal, an output terminal of the second NAND gate is connected with an input terminal of the fifth inverter, an output terminal of the fifth inverter is connected with an input terminal of the sixth inverter, an output terminal of the sixth inverter is connected with an input terminal of the seventh inverter, an output terminal of the seventh inverter outputs the second scanning signal.

The first reset circuit includes a first controllable switch and an eighth inverter, a control terminal of the first controllable switch receives the first reset signal, a first terminal of the first controllable switch receives the first voltage reference, a second terminal of the first controllable switch is connected with a third terminal of the first clock inverter and an input terminal of the eighth inverter, an output terminal of the eighth inverter is connected with a first terminal of the second clock inverter.

Each of the second scan drivers includes a second latch circuit configured to receive the clock signal, an input signal as well as outputting a second input signal, a second output circuit configured to receive the second input signal, the input signal, a third control signal and a fourth control signal as well as outputting a third scanning signal according to the third control signal and outputting a fourth scanning signal according to the fourth control signal, a second reset circuit configured to receive a first voltage reference, a second reset signal, configured to reset the second scan drivers.

The second latch circuit includes a ninth inverter, a third clock inverter and a fourth clock inverter, a first terminal of the ninth inverter, a second terminal of the third clock inverter and a second terminal of the fourth clock inverter receive the clock signal, a second terminal of the ninth inverter is connected with a fourth terminal of the third clock inverter and a second terminal of the fourth clock inverter, a first terminal of the third clock inverter receives the input signal, a third terminal of the third clock inverter is connected with a third terminal of the fourth clock inverter, a first terminal of the fourth clock inverter outputs the second input signal.

The second output circuit includes a third NAND gate, a fourth NAND gate, a tenth inverter, an eleventh inverter, a twelfth inverter, a thirteenth inverter, a fourteenth inverter and a fifteenth inverter, a first terminal of the third NAND gate receives the third control signal, a second terminal of the third NAND gate and a second terminal of the fourth NAND gate are connected with a first terminal of the fourth clock inverter, a third terminal of the third NAND gate and a third terminal of the fourth NAND gate receive the input signal, an output terminal of the third NAND gate is connected with an input terminal of the tenth inverter, an output terminal of the tenth inverter is connected with an input terminal of the eleventh inverter, an output terminal of the eleventh inverter is connected with an input terminal of the twelfth inverter, an output terminal of the twelfth inverter outputs the third scanning signal.

A first terminal of the fourth NAND gate receives the fourth control signal, an output terminal of the fourth NAND gate is connected with an input terminal of the thirteenth inverter, an output terminal of the thirteenth inverter is connected with an input terminal of the fourteenth inverter, an output terminal of the fourteenth inverter is connected with an input terminal of the fifteenth inverter, an output terminal of the fifteenth inverter outputs the fourth scanning signal.

The second reset circuit includes a second controllable switch and a sixteenth inverter, a control terminal of the second controllable switch receives the second reset signal, a first terminal of the second controllable switch receives the first voltage reference, a second terminal of the second controllable switch is connected with a third terminal of the third clock inverter and an input terminal of the sixteenth inverter, an output terminal of the sixteenth inverter is connected with a first terminal of the four clock inverter.

To solve the technical problem above, the disclosure further provides a flat panel display device, the flat panel display device includes a scan driving circuit, which includes a plurality of first scan drivers and a plurality of second scan drivers that are cascaded, the plurality of first scan drivers and the plurality of second scan drivers receive a clock signal alternately, the plurality of first scan drivers and the plurality of second scan drivers perform cascaded transmission according to the clock signal.

Each of the first scan drivers includes a first latch circuit configured to receive the clock signal and a driving signal as well as outputting a first input signal, a first output circuit configured to receive the first input signal, the driving signal, a first control signal and a second control signal as well as outputting a first scanning signal according to the first control signal and outputting a second scanning signal according to the second control signal, a first reset circuit configured to receive a first voltage reference, a first reset signal, configured to reset the first scan drivers.

The first latch circuit includes a first inverter, a first clock inverter and a second clock inverter, a first terminal of the first inverter, a fourth terminal of the first clock inverter and a second terminal of the second clock inverter receive the clock signal, a second terminal of the first inverter is connected with a second terminal of the first clock inverter and a fourth terminal of the second clock inverter, a first terminal of the first clock inverter receives the driving signal, a third terminal of the first clock inverter is connected with a third terminal of the second clock inverter, a first terminal of the second clock inverter outputs the first input signal.

The first output circuit includes a first NAND gate, a second NAND gate, a second inverter, a third inverter, a fourth inverter, a fifth inverter, a sixth inverter and a seventh inverter, a first terminal of the first NAND gate receives the first control signal, a second terminal of the first NAND gate and a second terminal of the second NAND gate are connected with a first terminal of the second clock inverter, a third terminal of the first NAND gate and a third terminal of the second NAND gate receive the driving signal, an output terminal of the first NAND gate is connected with an input terminal of the second inverter, an output terminal of the second inverter is connected with an input terminal of the third inverter, an output terminal of the third inverter is connected with an input terminal of the fourth inverter, an output terminal of the fourth inverter outputs the first scanning signal.

A first terminal of the second NAND gate receives the second control signal, an output terminal of the second NAND gate is connected with an input terminal of the fifth inverter, an output terminal of the fifth inverter is connected with an input terminal of the sixth inverter, an output terminal of the sixth inverter is connected with an input terminal of the seventh inverter, an output terminal of the seventh inverter outputs the second scanning signal.

The first reset circuit includes a first controllable switch and an eighth inverter, a control terminal of the first controllable switch receives the first reset signal, a first terminal of the first controllable switch receives the first voltage reference, a second terminal of the first controllable switch is connected with a third terminal of the first clock inverter and an input terminal of the eighth inverter, an output terminal of the eighth inverter is connected with a first terminal of the second clock inverter.

Each of the second scan drivers includes a second latch circuit configured to receive the clock signal and an input signal as well as outputting a second input signal, a second output circuit configured to receive the second input signal, the input signal, a third control signal and a fourth control signal as well as outputting a third scanning signal according to the third control signal and outputting a fourth scanning signal according to the fourth control signal, a second reset circuit configured to receive a first voltage reference, a second reset signal, configured to reset the second scan drivers.

The second latch circuit includes a ninth inverter, a third clock inverter and a fourth clock inverter, a first terminal of the ninth inverter, a second terminal of the third clock inverter and a second terminal of the fourth clock inverter receive the clock signal, a second terminal of the ninth inverter is connected with a fourth terminal of the third clock inverter and a second terminal of the fourth clock inverter, a first terminal of the third clock inverter receives the input signal, a third terminal of the third clock inverter is connected with a third terminal of the fourth clock inverter, a first terminal of the fourth clock inverter outputs the second input signal.

The second output circuit includes a third NAND gate, a fourth NAND gate, a tenth inverter, an eleventh inverter, a twelfth inverter, a thirteenth inverter, a fourteenth inverter and a fifteenth inverter, a first terminal of the third NAND gate receives the third control signal, a second terminal of the third NAND gate and a second terminal of the fourth NAND gate are connected with a first terminal of the fourth clock inverter, a third terminal of the third NAND gate and a third terminal of the fourth NAND gate receive the input signal, an output terminal of the third NAND gate is connected with an input terminal of the tenth inverter, an output terminal of the tenth inverter is connected with an input terminal of the eleventh inverter, an output terminal of the eleventh inverter is connected with an input terminal of the twelfth inverter, an output terminal of the twelfth inverter outputs the third scanning signal.

A first terminal of the fourth NAND gate receives the fourth control signal, an output terminal of the fourth NAND gate is connected with an input terminal of the thirteenth inverter, an output terminal of the thirteenth inverter is connected with an input terminal of the fourteenth inverter, an output terminal of the fourteenth inverter is connected with an input terminal of the fifteenth inverter, an output terminal of the fifteenth inverter outputs the fourth scanning signal.

The second reset circuit includes a second controllable switch and a sixteenth inverter, a control terminal of the second controllable switch receives the second reset signal, a first terminal of the second controllable switch receives the first voltage reference, a second terminal of the second controllable switch is connected with a third terminal of the third clock inverter and an input terminal of the sixteenth inverter, an output terminal of the sixteenth inverter is connected with a first terminal of the four clock inverter.

Beneficial effects of the disclosure are distinguishing from the prior art, the scan drivers of the disclosure include a plurality of first scan drivers and a plurality of second scan drivers that are cascaded, the plurality of first scan drivers and the plurality of second scan drivers receive a clock signal alternately, the plurality of first scan drivers and the plurality of second scan drivers perform cascaded transmission according to the clock signal. The disclosure performs cascaded transmission by interposing a clock signal, which can reduce the amount of input signals and simplify the array process.

BRIEF DESCRIPTION OF THE DRAWINGS

In order to more clearly illustrate embodiments of the disclosure, following figures described in embodiments will be briefly introduced, it is obvious that the drawings are merely some embodiments of the disclosure, a person skilled in the art can obtain other figures according to these figures without creativity.

DETAILED DESCRIPTION OF PREFERRED EMBODIMENTS

Embodiments of the disclosure will be described in detail with reference to the accompanying drawings as follows, obviously, the described embodiments are part of embodiments of the disclosure rather than all of them. Based on the embodiments of the disclosure, all other embodiments obtained by a person skilled in the art without creativity should be considered within the scope of protection of the disclosure.

Figure 1:
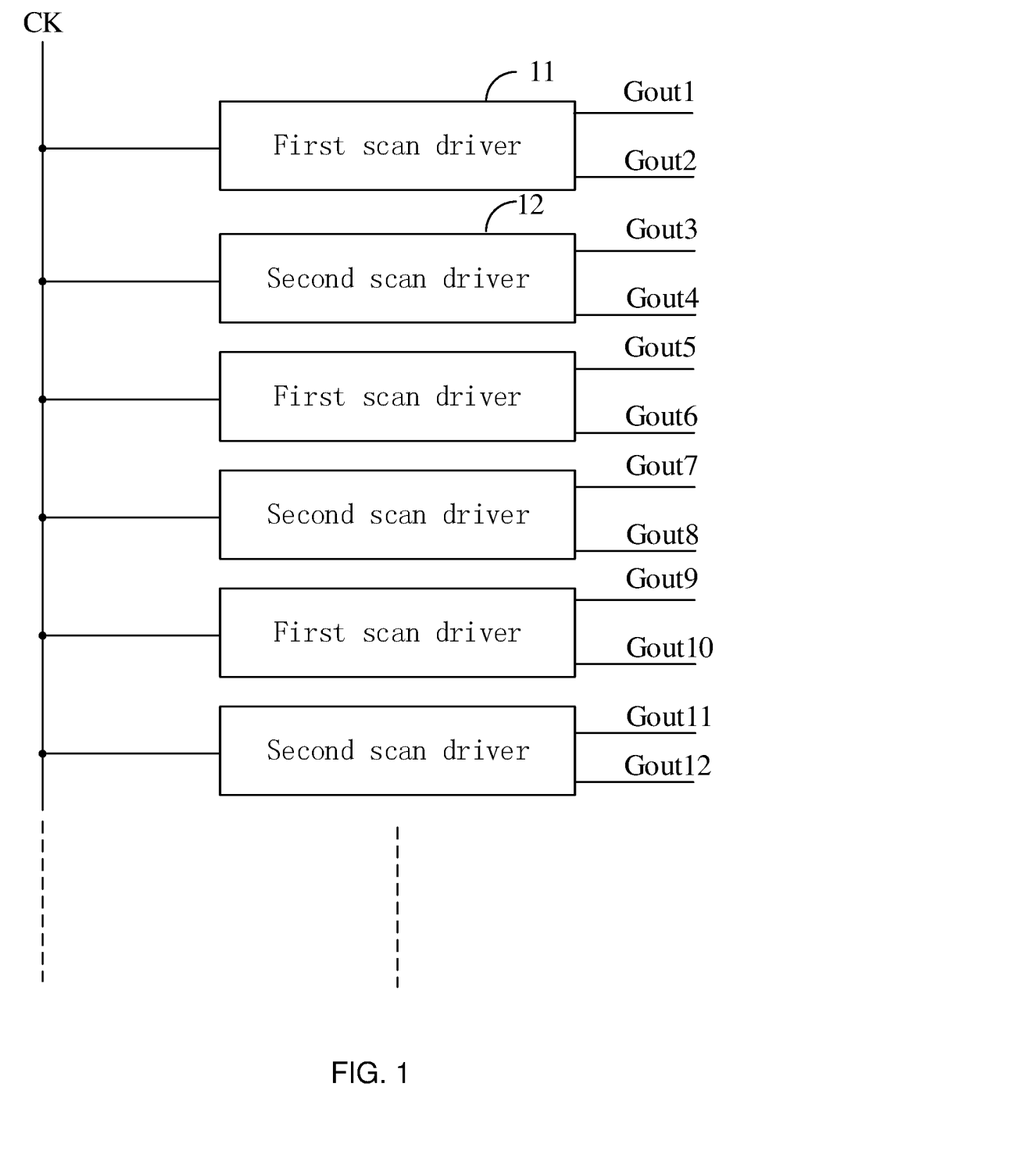
FIG. 1 is a structural schematic view of a scan driving circuit according to a first embodiment of the disclosure.
Figure 2:
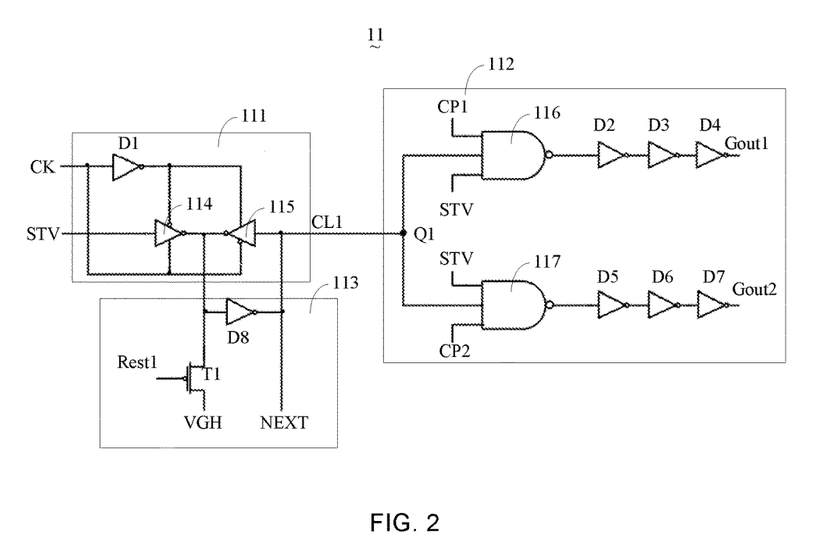
FIG. 2 is a circuit diagram of a first scan driver in FIG. 1.
Figure 3:
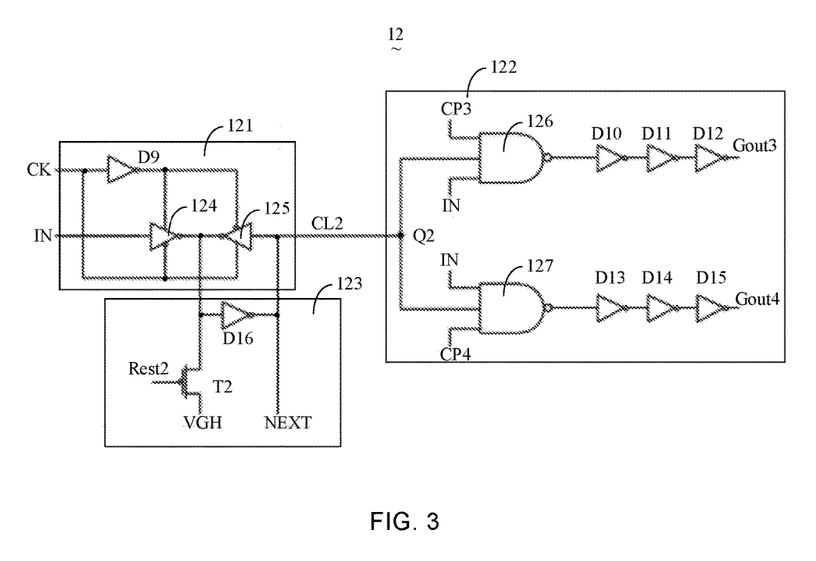
FIG. 3 is a circuit diagram of a second scan driver in FIG. 1.

Referring to FIGS. 1-3, FIG. 1 is a structural schematic view of a scan driving circuit according to a first embodiment of the disclosure. FIG. 2 is a circuit diagram of a first scan driver in FIG. 1. FIG. 3 is a circuit diagram of a second scan driver in FIG. 1. As shown in FIG. 1, a scan driving circuit 10 disclosed by the embodiment includes a plurality of first scan drivers 11 and a plurality of second scan drivers 12 that are cascaded, the plurality of first scan drivers 11 and the plurality of second scan drivers 12 receive a clock signal CK alternately, the plurality of first scan drivers 11 and the plurality of second scan drivers 12 perform cascaded transmission according to the clock signal CK.

As shown in FIG. 2, each of the first scan drivers 11 includes a first latch circuit 111, a first output circuit 112 and a first reset circuit 113 that are connected to the first latch circuit 111 respectively. The first latch circuit 111 is configured to receive the clock signal CK and a driving signal STV as well as outputting a first input signal CL1. The first output circuit 112 is configured to receive the first input signal CL1, the driving signal STV, a first control signal CP1 and a second control signal CP2 as well as outputting a first scanning signal Gout1 according to the first control signal CP1 and outputting a second scanning signal Gout2 according to the second control signal CP2. The first reset circuit 113 is configured to receive a first voltage reference VGH, a first reset signal Rest1, configured to reset the first scan drivers 11. The first voltage reference VGH is preferably a high level.

The first latch circuit 111 includes a first inverter D1, a first clock inverter 114 and a second clock inverter 115, a first terminal of the first inverter D1, a fourth terminal of the first clock inverter 114 and a second terminal of the second clock inverter 115 receive the clock signal CK, a second terminal of the first inverter D1 is connected with a second terminal of the first clock inverter 114 and a fourth terminal of the second clock inverter 115, a first terminal of the first clock inverter 114 receives the driving signal STV, a third terminal of the first clock inverter 114 is connected with a third terminal of the second clock inverter 114, a first terminal of the second clock inverter 114 outputs the first input signal CL1.

The first output circuit 112 includes a first NAND gate 116, a second NAND gate 117, a second inverter D2, a third inverter D3, a fourth inverter D4, a fifth inverter D5, a sixth inverter D6 and a seventh inverter D7, a first terminal of the first NAND gate 116 receives the first control signal CP1, a second terminal of the first NAND gate 116 and a second terminal of the second NAND gate 117 are connected with a first terminal of the second clock inverter 115, which form a first node Q1. A third terminal of the first NAND gate 116 and a third terminal of the second NAND gate 117 receive the driving signal STV, an output terminal of the first NAND gate 116 is connected with an input terminal of the second inverter D2 is, an output terminal of the second inverter D2 is connected with an input terminal of the third inverter D3, an output terminal of the third inverter D3 is connected with an input terminal of the fourth inverter D4, an output terminal of the fourth inverter D4 outputs the first scanning signal Gout1.

A first terminal of the second NAND gate 117 receives the second control signal CP2, an output terminal of the second NAND gate 117 is connected with an input terminal of the fifth inverter D5, an output terminal of the fifth inverter D5 is connected with an input terminal of the sixth inverter D6, an output terminal of the sixth inverter D6 is connected with an input terminal of the seventh inverter D7, an output terminal of the seventh inverter D7 outputs the second scanning signal Gout2.

The first reset circuit 113 includes a first controllable switch T1 and an eighth inverter D8, a control terminal of the first controllable switch T1 receives the first reset signal Rest1, a first terminal of the first controllable switch T1 receives the first voltage reference VGH, a second terminal of the first controllable switch T1 is connected with a third terminal of the first clock inverter 114 and an input terminal of the eighth inverter D8, an output terminal of the eighth inverter D8 is connected with a first terminal of the second clock inverter 115. The output terminal of the eighth inverter D8 is further connected with the second scan driver 12 on the next level.

Preferably, the first controllable switch T1 is an N type thin film transistor, in other embodiments, a person skilled in the art can adopt a P type thin film transistor as the first controllable switch T1.

As shown in FIG. 3, each of the second scan drivers 12 includes a second latch circuit 121, a second output circuit 122 and a second reset circuit 123 that are connected with the second latch circuit 121 respectively. The second latch circuit 121 is configured to receive the clock signal CK and an input signal IN, as well as outputting a second input signal CL2. The second output circuit 122 is configured to receive the second input signal CL2, the input signal IN, a third control signal CP3 and a fourth control signal CP4, as well as outputting a third scanning signal Gout3 according to the third control signal CP3 and outputting a fourth scanning signal Gout4 according to the fourth control signal CP4. The second reset circuit 123 is configured to receive a first voltage reference VGH, a second reset signal Rest2, configured to reset the second scan drivers 12.

Preferably, the third control signal CP3 and the first control signal CP1 are identical, the fourth control signal CP4 and the second control signal CP2 are identical.

The second latch circuit 121 includes a ninth inverter D9, a third clock inverter 124 and a fourth clock inverter 125, a first terminal of the ninth inverter D9, a second terminal of the third clock inverter 124 and a second terminal of the fourth clock inverter 125 receive the clock signal CK, a second terminal of the ninth inverter D9 is connected with a fourth terminal of the third clock inverter 124 and a second terminal of the fourth clock inverter 125, a first terminal of the third clock inverter 124 receives the input signal IN, a third terminal of the third clock inverter 124 is connected with a third terminal of the fourth clock inverter 125, a first terminal of the fourth clock inverter 125 outputs the second input signal CL2.

The second output circuit 122 includes a third NAND gate 126, a fourth NAND gate 127, a tenth inverter D10, an eleventh inverter D11, a twelfth inverter D12, a thirteenth inverter D13, a fourteenth inverter D14 and a fifteenth inverter D15, a first terminal of the third NAND gate 126 receives the third control signal CP3, a second terminal of the third NAND gate 126 and a second terminal of the fourth NAND gate 127 are connected with a first terminal of the fourth clock inverter 125, which form a second node Q2. A third terminal of the third NAND gate 126 and a third terminal of the fourth NAND gate 127 receive the input signal IN, an output terminal of the third NAND gate 126 is connected with an input terminal of the tenth inverter D10, an output terminal of the tenth inverter D10 is connected with an input terminal of the eleventh inverter D11, an output terminal of the eleventh inverter D11 is connected with an input terminal of the twelfth inverter D12, an output terminal of the twelfth inverter D12 outputs the third scanning signal Gout3.

A first terminal of the fourth NAND gate 127 receives the fourth control signal CP4, an output terminal of the fourth NAND gate 127 is connected with an input terminal of the thirteenth inverter D13, an output terminal of the thirteenth inverter D13 is connected with an input terminal of the fourteenth inverter D14, an output terminal of the fourteenth inverter D14 is connected with an input terminal of the fifteenth inverter D15, an output terminal of the fifteenth inverter D15 outputs the fourth scanning signal Gout4.

The second reset circuit 123 includes a second controllable switch T2 and a sixteenth inverter D16, a control terminal of the second controllable switch T2 receives the second reset signal Rest2, a first terminal of the second controllable switch T2 receives the first voltage reference VGH, a second terminal of the second controllable switch T2 is connected with a third terminal of the third clock inverter 124 and an input terminal of the sixteenth inverter D16, an output terminal of the sixteenth inverter D16 is connected with a first terminal of the four clock inverter 125. The output terminal of the sixteenth inverter D16 is further connected with the first scan driver 11 on the next level.

Preferably, the second controllable switch T2 is an N type thin film transistor, in other embodiments, a person skilled in the art can adopt a P type thin film transistor as the second controllable switch T2.

Figure 4:
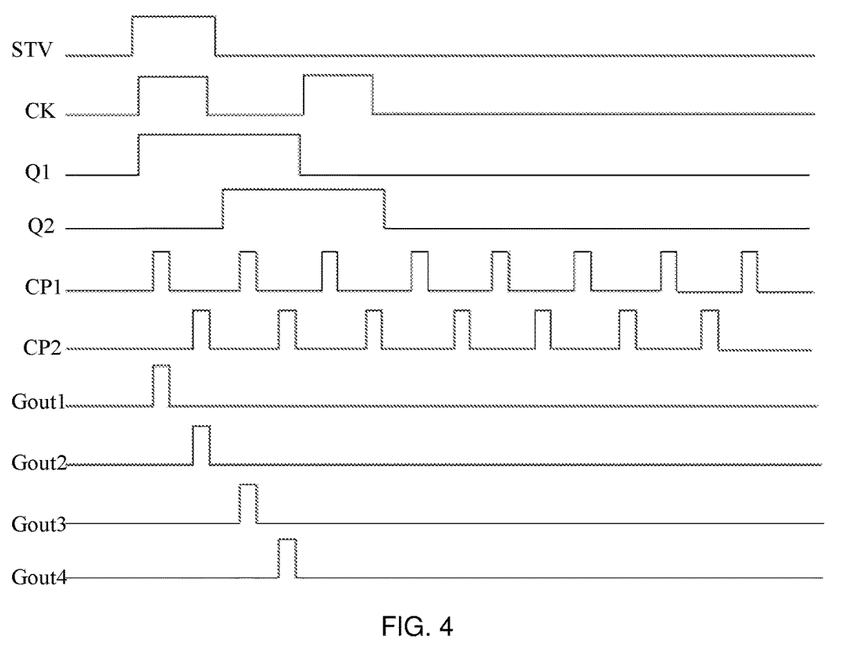
FIG. 4 is a sequence diagram of the scan driving circuit in FIG. 1.

The operational principle of the scan driving circuit 10 disclosed by the embodiment will be described in detail with reference to a sequence diagram shown in FIG. 4.

When the clock signal CK is a high level, the first latch circuit 111 is on transmission, the second latch circuit 121 is on latch. When the driving signal STV is a high level, the first node Q1 will be pulled up to a high level, when the first control signal CP1 is a high level, the first scanning signal Gout1 is a high level, a corresponding scanning line on a first level is open. When the second control signal CP2 is a high level, the second scanning signal Gout2 is a high level, a corresponding scanning line on a second level is open.

When the clock signal CK is a low level, the first latch circuit 111 is on latch, the second latch circuit 121 is on transmission. As the first node Q1 is a cascaded signal that maintains a high level, or when the input signal IN is a high level, the second node Q2 will be pulled up to a high level, when the third control signal CP3 is a high level, the third scanning signal Gout3 is a high level, a corresponding scanning line on a third level is open. When the fourth control signal CP4 is a high level, the fourth scanning signal Gout4 is a high level, a corresponding scanning line on a fourth level is open.

Loops are run as the operational principle above, the scan driving circuit 10 disclosed by the embodiment merely requires one clock signal CK to cascade, which can reduce the amount of input signals and simplify the array process.

Figure 5:
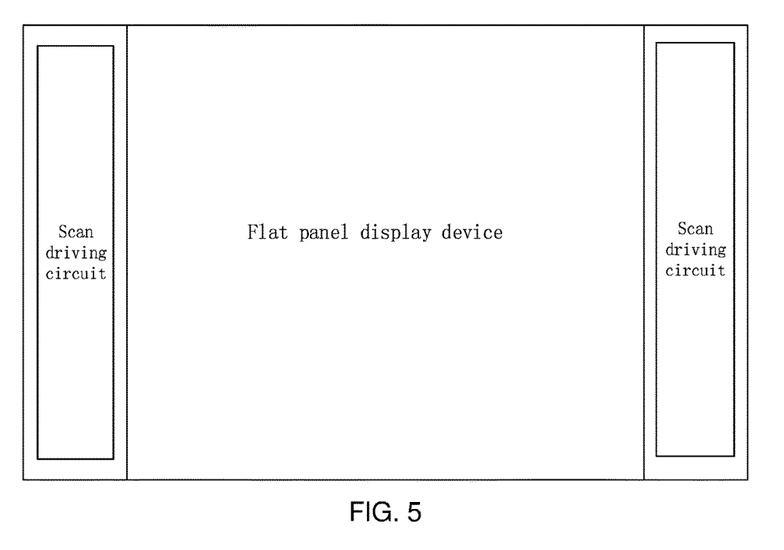
FIG. 5 is a structural schematic view of a flat panel display device according to the first embodiment of the disclosure.

As shown in FIG. 5, the disclosure further provides a flat panel display device of the first embodiment. As shown in FIG. 5, the flat panel display device includes the scan driving circuit 10 above, the scan driving circuits are disposed on two sides of the flat panel display device. Other components in the flat panel display device and functions thereof are identical to components in a conventional flat panel display device and functions thereof, which will not be repeated. The flat panel display device is a LCD or an OLED.

In summary, the scan drivers of the disclosure include a plurality of first scan drivers and a plurality of second scan drivers that are cascaded, the plurality of first scan drivers and the plurality of second scan drivers receive a clock signal alternately, the plurality of first scan drivers and the plurality of second scan drivers perform cascaded transmission according to the clock signal. The disclosure performs cascaded transmission by interposing a clock signal, which can reduce the amount of input signals and simplify the array process.

Above are merely embodiments rather than limitations of the disclosure, any equivalent structure or process according to the disclosure applied in other relative fields directly or indirectly should be covered by the protected scope of the disclosure.

What is claimed is:

1. A scan driving circuit, the scan driving circuit comprising a plurality of first scan drivers and a plurality of second scan drivers that are cascaded, wherein the plurality of first scan drivers and the plurality of second scan drivers receive a clock signal alternately, and the plurality of first scan drivers and the plurality of second scan drivers perform cascaded transmission according to the clock signal,
wherein each of the first scan drivers comprises:
a first latch circuit configured to receive the clock signal and a driving signal and output a first input signal;
a first output circuit configured to receive the first input signal, the driving signal, a first control signal and a second control signal, output a first scanning signal according to the first control signal and output a second scanning signal according to the second control signal; and
a first reset circuit configured to receive a first voltage reference and a first reset signal, and configured to reset the first scan drivers,
wherein the first latch circuit comprises a first inverter, a first clock inverter and a second clock inverter, a first terminal of the first inverter, a fourth terminal of the first clock inverter and a second terminal of the second clock inverter receive the clock signal, a second terminal of the first inverter is connected with a second terminal of the first clock inverter and a fourth terminal of the second clock inverter, a first terminal of the first clock inverter receives the driving signal, a third terminal of the first clock inverter is connected with a third terminal of the second clock inverter, and a first terminal of the second clock inverter outputs the first input terminal,
wherein the first output circuit comprises a first NAND gate, a second NAND gate, a second inverter, a third inverter, a fourth inverter, a fifth inverter, a sixth inverter and a seventh inverter, wherein a first terminal of the first NAND gate receives the first control signal, a second terminal of the first NAND gate and a second terminal of the second NAND gate are connected with a first terminal of the second clock inverter, a third terminal of the first NAND gate and a third terminal of the second NAND gate receive the driving signal, an output terminal of the first NAND gate is connected with an input terminal of the second inverter, an output terminal of the second inverter is connected with an input terminal of the third inverter, an output terminal of the third inverter is connected with an input terminal of the fourth inverter, and an output terminal of the fourth inverter outputs the first scanning signal, and
wherein a first terminal of the second NAND gate receives the second control signal, an output terminal of the second NAND gate is connected with an input terminal of the fifth inverter, an output terminal of the fifth inverter is connected with an input terminal of the sixth inverter, an output terminal of the sixth inverter is connected with an input terminal of the seventh inverter, and an output terminal of the seventh inverter outputs the second scanning signal.

2. The scan driving circuit according to claim 1, wherein the first reset circuit comprises a first controllable switch and an eighth inverter, a control terminal of the first controllable switch receives the first reset signal, a first terminal of the first controllable switch receives the first voltage reference, a second terminal of the first controllable switch is connected with a third terminal of the first clock inverter and an input terminal of the eighth inverter, and an output terminal of the eighth inverter is connected with a first terminal of the second clock inverter.

3. The scan driving circuit according to claim 1, wherein each of the second scan drivers comprises:
a second latch circuit configured to receive the clock signal and an input signal and output a second input signal;
a second output circuit configured to receive the second input signal, the input signal, a third control signal and a fourth control signal, output a third scanning signal according to the third control signal and output a fourth scanning signal according to the fourth control signal; and
a second reset circuit configured to receive the first voltage reference and a second reset signal, configured to reset the second scan drivers.

4. The scan driving circuit according to claim 3, wherein the second latch circuit comprises a ninth inverter, a third clock inverter and a fourth clock inverter, a first terminal of the ninth inverter, a second terminal of the third clock inverter and a second terminal of the fourth clock inverter receive the clock signal, a second terminal of the ninth inverter is connected with a fourth terminal of the third clock inverter and a second terminal of the fourth clock inverter, a first terminal of the third clock inverter receives the input signal, a third terminal of the third clock inverter is connected with a third terminal of the fourth clock inverter, and a first terminal of the fourth clock inverter outputs the second input signal.

5. The scan driving circuit according to claim 4, wherein the second output circuit comprises a third NAND gate, a fourth NAND gate, a tenth inverter, an eleventh inverter, a twelfth inverter, a thirteenth inverter, a fourteenth inverter and a fifteenth inverter, wherein a first terminal of the third NAND gate receives the third control signal, a second terminal of the third NAND gate and a second terminal of the fourth NAND gate are connected with a first terminal of the fourth clock inverter, a third terminal of the third NAND gate and a third terminal of the fourth NAND gate receive the input signal, an output terminal of the third NAND gate is connected with an input terminal of the tenth inverter, an output terminal of the tenth inverter is connected with an input terminal of the eleventh inverter, an output terminal of the eleventh inverter is connected with an input terminal of the twelfth inverter, and an output terminal of the twelfth inverter outputs the third scanning signal, and wherein a first terminal of the fourth NAND gate receives the fourth control signal, an output terminal of the fourth NAND gate is connected with an input terminal of the thirteenth inverter, an output terminal of the thirteenth inverter is connected with an input terminal of the fourteenth inverter, an output terminal of the fourteenth inverter is connected with an input terminal of the fifteenth inverter, and an output terminal of the fifteenth inverter outputs the fourth scanning signal.

6. The scan driving circuit according to claim 5, wherein the second reset circuit comprises a second controllable switch and a sixteenth inverter, a control terminal of the second controllable switch receives the second reset signal, a first terminal of the second controllable switch receives the first voltage reference, a second terminal of the second controllable switch is connected with a third terminal of the third clock inverter and an input terminal of the sixteenth inverter, and an output terminal of the sixteenth inverter is connected with a first terminal of the four clock inverter.

7. A flat display device, the flat display device comprising a scan driving circuit, wherein the scan driving circuit comprises a plurality of first scan drivers and a plurality of second scan drivers that are cascaded, the plurality of first scan drivers and the plurality of second scan drivers receive a clock signal alternately, and the plurality of first scan drivers and the plurality of second scan drivers perform cascaded transmission according to the clock signal, wherein each of the first scan drivers comprises:
a first latch circuit configured to receive the clock signal and a driving signal and output a first input signal;
a first output circuit configured to receive the first input signal, the driving signal, a first control signal and a second control signal, output a first scanning signal according to the first control signal and output a second scanning signal according to the second control signal; and
a first reset circuit configured to receive a first voltage reference and a first reset signal, configured to reset the first scan drivers, wherein the first latch circuit comprises a first inverter, a first clock inverter and a second clock inverter, a first terminal of the first inverter, a fourth terminal of the first clock inverter and a second terminal of the second clock inverter receive the clock signal, a second terminal of the first inverter is connected with a second terminal of the first clock inverter and a fourth terminal of the second clock inverter, a first terminal of the first clock inverter receives the driving signal, a third terminal of the first clock inverter is connected with a third terminal of the second clock inverter, and a first terminal of the second clock inverter outputs the first input terminal, wherein the first output circuit comprises a first NAND gate, a second NAND gate, a second inverter, a third inverter, a fourth inverter, a fifth inverter, a sixth inverter and a seventh inverter, wherein a first terminal of the first NAND gate receives the first control signal, a second terminal of the first NAND gate and a second terminal of the second NAND gate are connected with a first terminal of the second clock inverter, a third terminal of the first NAND gate and a third terminal of the second NAND gate receive the driving signal, an output terminal of the first NAND gate is connected with an input terminal of the second inverter, an output terminal of the second inverter is connected with an input terminal of the third inverter, an output terminal of the third inverter is connected with an input terminal of the fourth inverter, and an output terminal of the fourth inverter outputs the first scanning signal, and wherein a first terminal of the second NAND gate receives the second control signal, an output terminal of the second NAND gate is connected with an input terminal of the fifth inverter, an output terminal of the fifth inverter is connected with an input terminal of the sixth inverter, an output terminal of the sixth inverter is connected with an input terminal of the seventh inverter, and an output terminal of the seventh inverter outputs the second scanning signal.

8. The flat display device according to claim 7, wherein the first reset circuit comprises a first controllable switch and an eighth inverter, a control terminal of the first controllable switch receives the first reset signal, a first terminal of the first controllable switch receives the first voltage reference, a second terminal of the first controllable switch is connected with a third terminal of the first clock inverter and an input terminal of the eighth inverter, and an output terminal of the eighth inverter is connected with a first terminal of the second clock inverter.

9. The flat display device according to claim 7, wherein each of the second scan drivers comprises:
a second latch circuit configured to receive the clock signal and an input signal and output a second input signal;
a second output circuit configured to receive the second input signal, the input signal, a third control signal and a fourth control signal, output a third scanning signal according to the third control signal and output a fourth scanning signal according to the fourth control signal; and
a second reset circuit configured to receive the first voltage reference and a second reset signal, configured to reset the second scan drivers.

10. The flat display device according to claim 9, wherein the second latch circuit comprises a ninth inverter, a third clock inverter and a fourth clock inverter, a first terminal of the ninth inverter, a second terminal of the third clock inverter and a second terminal of the fourth clock inverter receive the clock signal, a second terminal of the ninth inverter is connected with a fourth terminal of the third clock inverter and a second terminal of the fourth clock inverter, a first terminal of the third clock inverter receives the input signal, a third terminal of the third clock inverter is connected with a third terminal of the fourth clock inverter, and a first terminal of the fourth clock inverter outputs the second input signal.

11. The flat display device according to claim 10, wherein the second output circuit comprises a third NAND gate, a fourth NAND gate, a tenth inverter, an eleventh inverter, a twelfth inverter, a thirteenth inverter, a fourteenth inverter and a fifteenth inverter, wherein a first terminal of the third NAND gate receives the third control signal, a second terminal of the third NAND gate and a second terminal of the fourth NAND gate are connected with a first terminal of the fourth clock inverter, a third terminal of the third NAND gate and a third terminal of the fourth NAND gate receive the input signal, an output terminal of the third NAND gate is connected with an input terminal of the tenth inverter, an output terminal of the tenth inverter is connected with an input terminal of the eleventh inverter, an output terminal of the eleventh inverter is connected with an input terminal of the twelfth inverter, and an output terminal of the twelfth inverter outputs the third scanning signal, and wherein a first terminal of the fourth NAND gate receives the fourth control signal, an output terminal of the fourth NAND gate is connected with an input terminal of the thirteenth inverter, an output terminal of the thirteenth inverter is connected with an input terminal of the fourteenth inverter, an output terminal of the fourteenth inverter is connected with an input terminal of the fifteenth inverter, and an output terminal of the fifteenth inverter outputs the fourth scanning signal.

12. The flat display device according to claim 11, wherein the second reset circuit comprises a second controllable switch and a sixteenth inverter, a control terminal of the second controllable switch receives the second reset signal, a first terminal of the second controllable switch receives the first voltage reference, a second terminal of the second controllable switch is connected with a third terminal of the third clock inverter and an input terminal of the sixteenth inverter, and an output terminal of the sixteenth inverter is connected with a first terminal of the four clock inverter.

* * * * *